United States Patent [19]

Falabella

[11] Patent Number: 5,474,816
[45] Date of Patent: Dec. 12, 1995

[54] FABRICATION OF AMORPHOUS DIAMOND FILMS

[75] Inventor: Steven Falabella, Livermore, Calif.

[73] Assignee: The Regents of the University of California, Oakland, Calif.

[21] Appl. No.: 47,176

[22] Filed: Apr. 16, 1993

[51] Int. Cl.$^6$ ........................................ C23C 16/26
[52] U.S. Cl. .................. 427/580; 427/249; 427/122; 427/255.7; 427/577; 423/446
[58] Field of Search ........................ 427/249, 577, 427/255.7, 580, 122; 423/446; 117/920

[56] References Cited

U.S. PATENT DOCUMENTS

| | | | |
|---|---|---|---|
| 4,707,384 | 11/1987 | Schachner et al. | 427/255.7 |
| 4,728,529 | 3/1988 | Etzkorn et al. | 427/577 |
| 4,961,958 | 10/1990 | Desphandey et al. | 427/577 |
| 5,110,679 | 5/1992 | Haller | 428/408 |

OTHER PUBLICATIONS

Grant & Hackh's Chemical Dictionary, 5th ed.; McGraw Hill p. 180 1987.

Beer, F. P., and Johnston, E. R., Mechanics of Materials; McGraw Hill 1981 pp. 2–3.

Hackh's Chemical Dictionary, Fourth Edition, 1969 p. 208.

D. R. McKenzie, D. Muller, B. A. Pailthorpe—"Compressive–Stress–Induced Formation of Thin–Film Tetrahedral Amorphous Carbon," Aug. 5, 1991, pp. 773–776, Physical Review Letters, vol. 67, No. 6.

D. F. Franceschini & C. A. Achete & F. L. Freire, Jr., "Internal Stress Reduction by nitrogen incorporation in Hard Amorphous Carbon Thin Films", Appl. Phys. Lett. 60(26) 29 Jun. 1992 pp. 3229–3231.

C. J. Tong & J. M. Sivertsen & C. Chang, "Structure and Bonding Studies of the C:N Thin Films Produced by rf Sputtering Method," J. Mater. Res., vol. 5, No. 11, Nov. 1990, pp. 2490–2496.

Crans–Montana, Switzerland, 1990, "Diamond and Related Materials," vol. 1, p. 61 (1991).

*Primary Examiner*—Roy V. King
*Attorney, Agent, or Firm*—Henry P. Sartorio

[57] ABSTRACT

Amorphous diamond films having a significant reduction in intrinsic stress are prepared by biasing a substrate to be coated and depositing carbon ions thereon under controlled temperature conditions.

17 Claims, 1 Drawing Sheet

FABRICATION OF AMORPHOUS DIAMOND FILMS

ORIGIN OF THE INVENTION

The U.S. Government has rights in this invention pursuant to Contract No. W-7405-ENG-48 between the U.S. Department of Energy and the University of California for the operation of the Lawrence Livermore National Laboratory.

BACKGROUND OF THE INVENTION

Amorphous diamond is an electrically insulating, inert, transparent allotrope of carbon. This type of diamond is called amorphous because it lacks a long-range ordered structure. Amorphous diamond contains little or no hydrogen and is characterized by extraordinary hardness. By contrast, diamond-like carbon (DLC) is hydrogenated and softer than amorphous diamond. Various properties of amorphous diamond are described by D. R. McKenzie et al. in "Proc. Diamond Films '90, Crans-Montana, Switzerland 1990", in *Diamond and Related Materials*, Vol. 1, p. 61 (1991).

Amorphous diamond is not well suited for commercial applications because of its high intrinsic stress and poor adhesion properties. After depositing a coating of amorphous diamond on a substrate, the coating expands, but its expansion is limited because it is bound to the substrate. As a result, pressure builds up and creates stress that is known as intrinsic stress. The poor adhesion of amorphous diamond limits the thickness of coatings which may be applied. In addition, the intrinsic stress of thick diamond-like carbon films deposited on a substrate has been shown by C. J. Torng et al. to cause delamination of the film from the substrate (See "Structure and Bonding Studies of the C:N Thin Films Produced by RF Sputtering Method" in J. Mater. Res., Vol. 5, No. 11 p. 2493 (November 1990).)

The effects of incorporating nitrogen into different types of carbon has been reported with varying degrees of success. Franceschini et al. reported on the effects of incorporating nitrogen into hydrogenated carbon thin films in Applied Physics Letters, Vol. 60, No. 26 at pp. 3229–3231 (Jun. 29, 1992). U.S. Pat. No. 5,110,679 to Haller describes the formation of a crystalline carbon nitride by sputtering carbon in the presence of a nitrogen atmosphere onto a single crystal germanium or silicon substrate.

Among the techniques used to prepare diamond films, chemical vapor deposition (CVD) is the most common. However, CVD-produced diamond films often have poor adhesion, excessive (thermally induced) stress and generally require deposition temperatures above 800° C.

Therefore, a method for coating amorphous diamond onto a substrate which overcomes the aforementioned difficulties is highly desirable.

SUMMARY OF THE INVENTION

One object of the present invention is to provide a method for coating a substrate with an amorphous diamond film which overcomes the aforementioned problems of the related art.

A second object of the invention is to coat a substrate with an amorphous diamond film by cooling and biasing said substrate and condensing carbon ions thereon.

A third object of the invention is to produce an amorphous diamond film characterized by sufficient hardness and reduced intrinsic stress.

A fourth object of the present invention is to provide a method for coating various instruments and tools with amorphous diamond.

Yet another object of the invention is to produce an article of manufacture that has at least one surface with an amorphous diamond film coating having an intrinsic stress substantially below 6 GPa.

Amorphous diamond films in accordance with the present invention have been produced having improved adhesion and a minimal amount of intrinsic stress. Impurity ions may be added to said film to enhance its characteristics. The impurity atoms may include nitrogen, silicon, boron, aluminum, germanium and phosphorus.

The present invention provides a method for coating a substrate with an amorphous diamond film by cooling a substrate; biasing the substrate; and condensing carbon ions thereon. In the above process, the substrate may be cooled while carbon ions are being condensed onto said substrate. The article may be coated at room temperature or alternatively, below room temperature, depending on the coolant selected.

An intermediate layer may be optionally deposited onto said substrate prior to coating with carbon ions. In which case, the intermediate layer preferably comprises a carbide-forming metal.

The substrate may be coated within a vacuum chamber and biased between about −70 v and about −225 v. In addition, the biasing is preferably radio frequency biasing. In a preferred embodiment, the carbon ions are produced by a cathodic arc source.

The present invention concerns depositing onto a biased substrate at least one layer of amorphous diamond to produce a film having a hardness above 25 GPa and an intrinsic stress below 6.0 GPa.

The method of this invention may be used to impart a durable surface to various articles of manufacture by coating at least one surface on such articles with an amorphous diamond film formed by the process disclosed herein. The resulting articles have features that are characterized by an intrinsic stress below 6 GPa. Among the articles of manufacture which may be coated in accordance with the invention are tools, instruments, medical implants and magnetic media. In particular, articles of manufacture produced in accordance with the present invention may include metrology blocks, caliper faces, precision slides, disk heads and scalpels. In addition, the present invention may also be used to coat mechanical components of spacecraft.

DETAILED DESCRIPTION OF THE PREFERRED EMBODIMENTS

Figure 1:
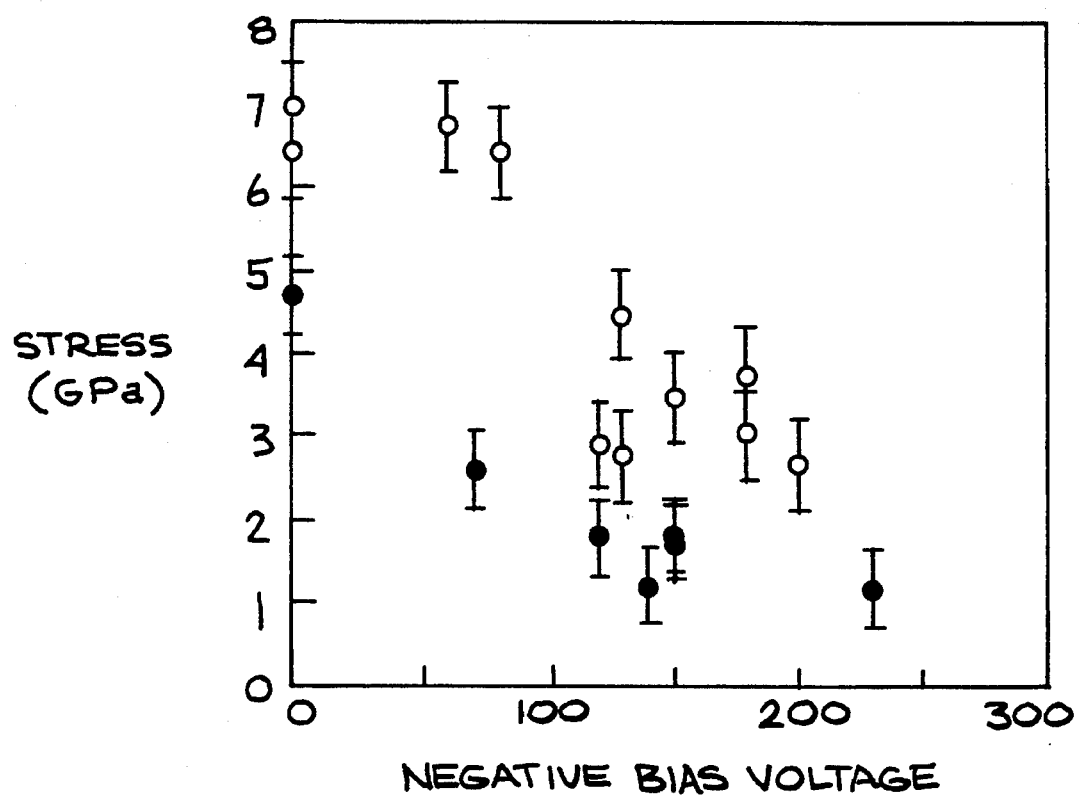
FIG. 1 is a plot of intrinsic stress versus bias voltage on the substrate for coatings in accordance with the present invention with and without nitrogen.

The present invention provides a method for forming an amorphous diamond film on a substrate comprising the steps of cooling said substrate; biasing said substrate and condensing carbon ions onto said cooled substrate.

Amorphous diamond typically has a high intrinsic stress in the range of approximately 6–7 GPa. By contrast, amorphous diamond films produced in accordance with the present invention have an intrinsic stress in the range of approximately 1 to 2 GPa. This intrinsic stress reduction enables one to take advantage of the hardness, toughness, adhesion and wear resistance of amorphous diamond. High stress levels can limit coating thickness to unacceptably small values due to delamination or distortion of the substrate. Prior to this invention, delamination would occur in films having a coating thickness of 0.2 to 1.0 micrometers. Consequently, the hardness, toughness, adhesion and wear resistance can be industrially manipulated once the intrinsic stress is significantly reduced in accordance with the present invention.

By reducing the intrinsic stress of amorphous diamond, it is now possible to provide a more durable coating on tool bits, thereby enhancing the lifetime of calibration tools coated with amorphous diamond. In addition, the low friction coefficient of amorphous diamond allows these coatings to be used as a durable solid lubricant, thereby preventing and/or delaying the failure of mechanical systems. Consequently, this type of application has significant value in an inaccessible environment, such as on spacecraft. Further possible applications of amorphous diamond films made in accordance with the present invention include coatings on medical implants and medical instruments, as well as coatings on magnetic media surfaces and disk heads.

The density, hardness and intrinsic stress level of amorphous diamond depend on the ratio of $sp^3$ to $sp^2$ bonds. In general, the higher the $sp^3$ fraction, the higher the density, hardness and intrinsic stress of the amorphous diamond material. The $sp^3$ to $sp^2$ bond ratio can be controlled by process conditions during deposition such as incident carbon ion energy, substrate surface temperature, and impurity concentration. It was found that several important parameters of the process can be affected by changes in the substrate surface temperature if the bias voltage of the substrate is maintained at an appropriate level, preferably at least at a negative voltage of 70 (−70 volts). Increasing the incident carbon ion energy (via substrate bias) increases the heat flux of the carbon ions and the surface temperature of the substrate. Stress may be further reduced by adding a dopant to the amorphous diamond film in the deposition chamber. Any dopant may be used which provides an additional degree of freedom to the $sp^3$ bond network. Examples of suitable dopants include silicon, boron, nitrogen, aluminum, germanium and phosphorus. Nitrogen is preferably used as the dopant. The dopant is generally ionized by the arc plasma and is then accelerated by the bias on the substrate, which also adds to the heat flux of the carbon ions.

The present invention also provides an amorphous diamond characterized by a reduced intrinsic stress. Amorphous diamond typically has a high intrinsic stress of 6–7 GPa. By contrast, amorphous diamond films produced in accordance with the invention can have an intrinsic stress of 1 to 2 GPa. The intrinsic stress of films produced in accordance with the invention may be lowered by a factor of two by biasing the substrate while depositing amorphous diamond onto the substrate. Incorporating a dopant, in combination with substrate biasing, will reduce the intrinsic stress of an amorphous diamond film by a factor of five. Although the hardness of amorphous diamond films of this invention is affected, it is still above 25 GPa. Nevertheless, the hardness is still higher than most materials and the deposited film is well suited to many industrial applications.

As noted above, control of the substrate temperature is important because the intrinsic stress is significantly reduced and the amorphous diamond films have been found to adhere better to a substrate. The substrate to be coated is cooled with a suitable coolant either directly or indirectly. For example, the substrate may be placed in a cooled holder. Moreover, the coolant may be selected from any heat-conducting medium. Preferably the heat-conducting medium is liquid nitrogen or water. When the substrate is cooled at room temperature the preferred coolant is water. Although, when liquid nitrogen is used as the coolant, the substrate is coated below room temperature.

Suitable substrates include those which are capable of forming a carbide compound, such as silicon, aluminum, tantalum, titanium, molybdenum and chromium. In addition, tungsten carbide, tool steel, stainless steel, and certain plastics may also be used. A preferred plastic is LEXAN®, a polycarbonate produced by General Electric Co.

The substrate may optimally be coated with an intermediate layer prior to coating a substrate with amorphous diamond. The intermediate layer acts as a binder to improve the adhesion of the substrate to amorphous diamond. Suitable intermediate layers include chromium and titanium. Alternatively, a DC bias voltage of 1–5 kV may be applied to the substrate to form a diffuse interface.

Carbon ions from a source that produces a carbon ion beam in the 20 to 200 eV range are condensed onto substrates. The substrate is biased with an energy source. Preferably the energy source comprises a radio frequency generator and impedance matching network that maintains the voltage between approximately −70 and −225 volts. Biasing the substrate by itself will reduce the intrinsic stress of amorphous diamond. However, biasing and doping the substrate with dopant will further reduce the intrinsic stress.

In one embodiment, the substrate is a target in a chamber, such as a vacuum chamber. Carbon ions are deposited onto the substrate with an energy source. In a preferred embodiment, the ion source is a cathodic arc source. Details concerning a suitable cathodic arc source may be found in co-pending U.S. patent application, Ser. No. 07/921,780, entitled "Filtered Cathodic Arc Source" filed Jul. 30, 1992, now U.S. Pat. No. 5,279,723.

The density of amorphous diamond has been measured. Film thickness is measured at the location of the Rutherford Backscattering (RBS) probe beam using profilometry and interference fringes. These measurements in turn indicated the density of amorphous diamond as being 2.7±0.3 g/cc, which is between graphite (2.26 g/cc) and diamond (at 3.5 g/cc).

The following examples are provided to illustrate certain preferred embodiments of the invention. However, the examples are not to be construed as limiting the scope of the invention to the details recited therein.

EXAMPLES

Example 1

A tungsten carbide tool bit was placed in a vacuum chamber. Carbon was deposited on the tool bit using an ionized beam of carbon having a mean energy of 22 eV to form an amorphous diamond film thereon. The substrate was biased between −150 and −200 volts. Coatings of up to 8 micrometers were produced without the appearance of any delamination. Intrinsic stress of the amorphous diamond film was reduced by a factor of 2.

Example 2

A tungsten carbide tool was coated in accordance with the process of Example 1. A partial pressure of 0.10 mTorr of nitrogen was added to the chamber during deposition. Rutherford Backscattering indicated a nitrogen content of 7% in the amorphous diamond film. The substrate was biased with voltage above −120 v. Intrinsic stress was reduced by a factor of 5. Hardness of the films was found to be 6000 Hv using the Vickers test.

Example 3

Amorphous diamond films were produced on cooled substrates using a filtered cathodic arc system. The cathodic arc source produces a carbon ion beam from a graphite cathode in a high vacuum environment. Macroparticles and neutral atoms are separated from the carbon ions by magnetically guiding the plasma produced at the cathode through a bent tube. The cathodic arc produces carbon ions with predominantly a single charge, and at a mean energy of 22 eV. The deposition rate of amorphous diamond in the filtered-arc system is approximately 40 Å/sec (15 μm/hr) with an arc current of 100 amperes.

The carbon ions condense on substrates attached to a cooled and biasable holder which limits the substrate temperature during deposition. Because incident ions have sufficient energy to embed several monolayers into the substrate surface, coatings on cemented carbide tool bits and polished silicon wafers with adhesion above 10 kpsi were produced.

Various techniques were employed to characterize the properties of the coated films produced in accordance with this invention. Reference is occasionally made to other types of carbon whenever such comparisons are deemed necessary to the description of the present invention.

The hardness of diamond-like carbon decreases as the percentage of hydrogen increases. By contrast, hard amorphous diamond films produced in accordance with the present invention, were characterized as being low in hydrogen content. Forward Recoil Scattering was used to measure the hydrogen content as being less than 0.1%.

Placing facets (small plane surfaces) on diamond material is known as polishing and is another method for assessing hardness. Abrading various hard materials such as natural and synthetic diamond against a plate coated with amorphous diamond resulted in facets in these and all materials tested. This indicated that the amorphous diamond coating is approximately as hard as natural diamond.

Optical-probe-beam (mirage effect) detection of thermal waves was used to measure the thermal diffusivity of a substrate coated with amorphous diamond in accordance with the present invention, The coated sample was heated with a laser beam that is chopped at audio frequencies. Energy from the laser spreads out and heats the air above the sample, changing its refractive index. The spatial and temporal evolution of the resulting thermal waves are observed by the changing refraction of a probe laser beam scanned across the surface at a grazing angle. To measure thermal diffusivity, only the intensity profile and phase of the thermal waves is needed. About 100 nm of niobium was sputtered onto a silicon wafer. A subsequent coat of amorphous diamond (2000 nm layer) absorbed the laser beam heat, since amorphous diamond is transparent to laser light. Analysis of the data indicated a thermal diffusivity of 0.015±0.003 $cm^2$/sec.

The greatest difficulty in commercially applying amorphous diamond films arises from their high intrinsic stress. This difficulty exists regardless of whether amorphous diamond films are deposited with chemical or physical means. For example, a filtered cathodic-arc source produces an ionized beam of carbon at a mean energy of 22 eV which alone produces stress levels of 6 to 10 GPa on electrically floating substrates. This intrinsic stress can be reduced by increasing the incident ion energy impinging on the substrate. In accordance with the invention, the intrinsic stress in amorphous films were reduced by a factor of two by depositing carbon ions onto a substrate while it is being biased at a voltage that is negative with respect to the substrate being coated. The substrate is preferably RF biased between approximately −70 volts and approximately −225 volts. More preferably, the bias voltage is between −150 and −200 volt bias. Intrinsic stress was inferred from the bowing of silicon wafers having a 2 inch diameter. Measured stress versus bias voltage is shown in FIG. 1. Solid circles represent coatings containing nitrogen and hollow circles represent coatings without nitrogen. On carbide-forming materials, the adhesion is sufficient to produce thick coatings without the compressive stress causing delamination as long as the bias voltage is maintained above −120 volts during deposition. In this manner, coatings of up to 8 micrometers thick have been produced on a tungsten carbide tool bit without delamination. An amorphous diamond film greater than 8 micrometers may also be produced using the process of this invention.

The fine structure of amorphous diamond was characterized by transmission electron microscopy (TEM) and electron diffraction. Unlike natural diamond or diamond-like carbon, amorphous diamond has a flat transmission spectrum from 0.8 to over 50 μm, which is due to its amorphous nature and lack of hydrogen. A TEM micrograph image of amorphous diamond films prepared in accordance with the invention was produced using an accelerating voltage of 200 kV. The image showed a uniform, random pattern that evidenced the absence of any structural order down to 10 Å.

The transmission of a free-standing film of 2.4 μm thickness was measured using a FTIR spectrophotometer and did not show any strong absorption over the entire region. The index of refraction was calculated from the interference between the front and back surfaces and the measured film thickness. The index of refraction of each sample tested was nearly constant over the entire wavelength range, but varied slightly from sample to sample. However, all films measured indicated a refractive index between approximately 2.47 and 2.57. These values are close to the refractive index of natural diamond of 2.42.

Thus the present invention provides numerous methods for reducing the intrinsic stress of amorphous diamond without reducing its hardness to impractical levels. Accordingly, the present invention is useful for producing a coating on various types of tools and instruments for measuring, treating and cutting purposes.

While particular embodiments of this invention have been shown and described, it is readily understood that numerous modifications may be made to the method that would fall within the scope of the appended claims. For example, the deposition conditions may be varied to provide a range of hardness and stress levels. Moreover, the material for the substrate and intermediate layer may be modified in order to provide better adaptability to various types of applications.

What is claimed is:

1. A method of coating a substrate with amorphous diamond comprising:

(a.) cooling said substrate to room temperature or below;

(b) biasing said substrate at a voltage between about −70 and −225 volts; and (c) condensing carbon ions having an energy of about 20 to 200 eV. onto said substrate to coat said substrate with a film of substantially hydrogen free amorphous diamond having an intrinsic stress of substantially below 6 GPa.

2. The method of claim 1 further comprising adding impurity ions to said film.

3. The method of claim 2, wherein said impurity ions are selected from the group consisting of nitrogen, silicon, boron, aluminum, germanium and phosphorus.

4. The method of claim 1, wherein said substrate is cooled while said carbon ions are being condensed onto said substrate.

5. The method of claim 1, further comprising depositing an intermediate layer onto said substrate prior to coating with carbon ions.

6. The method of claim 5, wherein said intermediate layer comprises a carbide-forming metal.

7. The method of claim 1, wherein said substrate is coated within a vacuum chamber.

8. The method of claim 1, wherein the carbon ions are produced by a cathodic arc source.

9. The method of claim 1, wherein said biasing comprises radio frequency biasing.

10. The method of claim 1, wherein said film of amorphous diamond is characterized by an intrinsic stress of about 1–2 GPa.

11. The method of claim 1, wherein said substrate is cooled with a coolant selected from either water or liquid nitrogen.

12. The method of claim 11, wherein said substrate is coated at room temperature.

13. The method of claim 11, wherein said substrate is coated below room temperature.

14. The method of claim 11, wherein said amorphous diamond coating is characterized by a hardness above 25 GPa.

15. The method of claim 2, wherein said impurity ions are nitrogen.

16. The method of claim 8, further comprising introducing dopants into said substrate by ionizing said dopants with said cathodic arc source.

17. The method of claim 16, further comprising accelerating said dopants while biasing said substrate.

* * * * *